(12) United States Patent
Lee et al.

(10) Patent No.: US 7,880,490 B2
(45) Date of Patent: Feb. 1, 2011

(54) WIRELESS INTERFACE PROBE CARD FOR HIGH SPEED ONE-SHOT WAFER TEST AND SEMICONDUCTOR TESTING APPARATUS HAVING THE SAME

(75) Inventors: Sang-Hoon Lee, Gyeongg-do (KR);
Kwang-Yong Lee, Gyeonggi-do (KR);
Se-Jang Oh, Gyeonggi-do (KR);
Young-Soo An, Gyeonggi-do (KR)

(73) Assignee: Samsung Electronics Co., Ltd.,
Yeongtong-gu, Suwon-si, Gyeonggi-do (KR)

( * ) Notice: Subject to any disclaimer, the term of this patent is extended or adjusted under 35 U.S.C. 154(b) by 154 days.

(21) Appl. No.: 12/200,716

(22) Filed: Aug. 28, 2008

(65) Prior Publication Data

US 2009/0066350 A1 Mar. 12, 2009

(30) Foreign Application Priority Data

Sep. 7, 2007 (KR) ...................... 10-2007-0091224

(51) Int. Cl.
*G01R 31/28* (2006.01)
(52) U.S. Cl. ..................................... 324/763
(58) Field of Classification Search .............. 324/158.1, 324/754–762, 765
See application file for complete search history.

(56) References Cited

U.S. PATENT DOCUMENTS

| | | | |
|---|---|---|---|
| 6,002,375 A * | 12/1999 | Corman et al. .............. 343/853 |
| 6,292,006 B1 * | 9/2001 | Fredrickson ................ 324/754 |
| 6,563,333 B2 * | 5/2003 | Hatamian ................... 324/765 |
| 6,685,202 B2 * | 2/2004 | Fujimoto ............. 280/124.109 |
| 7,076,217 B1 * | 7/2006 | Luff et al. ...................... 455/84 |
| 7,109,730 B2 * | 9/2006 | Slupsky ...................... 324/753 |
| 2005/0086021 A1 * | 4/2005 | Khandros et al. ........... 702/121 |
| 2005/0174131 A1 * | 8/2005 | Miller ........................ 324/754 |
| 2005/0225347 A1 * | 10/2005 | Khandros et al. ........... 324/763 |
| 2005/0237073 A1 | 10/2005 | Miller et al. |

FOREIGN PATENT DOCUMENTS

| | | |
|---|---|---|
| JP | 2004-253561 | 9/2004 |
| KR | 2004-0048254 | 6/2004 |
| WO | WO 2005/103740 | 11/2005 |

OTHER PUBLICATIONS

English language abstract of Korean Publication No. 2004-0048254.
English language abstract of Japanese Publication No. 2004-253561.

* cited by examiner

*Primary Examiner*—Ha Tran T Nguyen
*Assistant Examiner*—Joshua Benitez
(74) *Attorney, Agent, or Firm*—Muir Patent Consulting, PLLC

(57) ABSTRACT

A wireless interface probe card includes a substrate member and a transmission member. The substrate member has a plurality of probe terminals arranged at a constant pitch. The probe terminals may directly contact a plurality of pads arranged at a constant pitch on each of a plurality of semiconductor chips arranged on a wafer to perform a test of the semiconductor chips arranged on the wafer. The transmission member is arranged on the substrate member, wirelessly receives a test signal and provides the received test signal to the pads of the wafer through the probe terminals, and wirelessly and externally transmits an electrical characteristic signal provided from the pads of the wafer through the probe terminals.

20 Claims, 12 Drawing Sheets

WIRELESS INTERFACE PROBE CARD FOR HIGH SPEED ONE-SHOT WAFER TEST AND SEMICONDUCTOR TESTING APPARATUS HAVING THE SAME

CROSS-REFERENCE TO RELATED PATENT APPLICATIONS

This application claims the benefit of Korean Patent Application No. 10-2007-0091224, filed on Sep. 7, 2007, in the Korean Intellectual Property Office, the disclosure of which is incorporated herein in its entirety by reference.

BACKGROUND OF THE INVENTION

1. Field of the Invention

The present invention relates to a semiconductor wafer testing apparatus, and more particularly, to a wireless interface probe card capable of performing a high speed one-shot wafer test of a semiconductor wafer at high speed using wireless data communication, and a semiconductor testing apparatus having the same.

2. Description of the Related Art

In general, a semiconductor device is created through a series of semiconductor manufacturing steps, including those of manufacturing a semiconductor wafer, manufacturing unit semiconductor chips on the semiconductor wafer, electrically testing a semiconductor chip to determine whether the semiconductor chip is defective (e.g., electrical die sorting (EDS) test), packaging test-passed semiconductor chips, and finally, testing packaged semiconductor chips. The EDS test is to determine whether the semiconductor chip formed on the wafer is electrically good or defective using a testing apparatus that determines defectiveness by applying an electrical signal to the semiconductor chip on the wafer.

The testing apparatus includes a tester to generate an electric signal and a probe card. A plurality of pads are arranged on each of the semiconductor chips of the semiconductor wafer. The probe card includes a plurality of needles so that the needles contact the pads. The probe card transfers a test signal generated by the tester to the semiconductor chips on the wafer via the needles contacting the pads of the wafer. The probe may also transfer the electric signal from the semiconductor chips on the wafer to the tester.

FIG. 1A is a plan view of a conventional probe card 10. FIG. 1B is a cross-sectional view of the probe card 10 of FIG. 1A. Referring to FIGS. 1A and 1B, the probe card 10 includes a printed circuit board (PCB) 20 having a through hole 25 at the central portion thereof and a plurality of needles 30 attached to the bottom surface of the PCB 20. The needles 30 are supported by a support member 40.

When the EDS test is performed for a semiconductor wafer 50 using the probe card 10, the needles 30 of the probe card 10 and a plurality of pads 65 of a semiconductor chip 60 on the wafer 50 mounted on a wafer stage 70 contact each other. A tester (not shown) transmits a test signal to the semiconductor chip 60 of the semiconductor wafer 50 via the probe card 10 and receives an electric characteristic signal from the semiconductor chip 60 via the probe card 10. Thus, the tester determines the defectiveness of the semiconductor chip 60 based on the electric characteristic signal provided by the semiconductor chip 60.

However, when the PCB 20 is stacked in multiple layers, the probe card 10 is unable to transmit a high frequency signal over 1 GHz due to signal integrity and power integrity. Also, the needles 30 need to be attached to the PCB 20 corresponding to the number of the pads 65 of the semiconductor chip 60.

When a one-shot test is performed, the number of pads of the semiconductor chip 60 must be identical to that of the needles 30 of the probe card 10. But as the size of a wafer increases, performing the one-shot test is difficult or impossible.

In order to enable the one-shot test of a large-size wafer, the number of the needles 30 of the probe card 10 needs to be increased, which makes manufacture of the probe card 10 difficult. Also, as the number of the needles 30 of the probe card 10 increases, pitch of the needles 30 decreases so that short-circuits are formed between the needles 30, thereby making it difficult to accurately determine the defectiveness of the semiconductor chip 60.

In addition, since the probe card 10 physically contacts a performance board (not shown), the probe card 10 or the semiconductor wafer 50 may be damaged due to stress occurring when the probe card 10 contacts the performance board. Also, a difference in the coefficient of thermal expansion (CTE) between the semiconductor wafer 50 and the probe card 10 causes defective contacts between the pads 65 of the semiconductor wafer 50 and the needles 30 of the probe card 10.

SUMMARY OF THE INVENTION

To solve the above and/or other problems, some embodiments of the present invention provide a wireless interface probe card for high speed one-shot wafer testing. Specifically, a one-shot test of a semiconductor wafer can be performed at high speed using wireless data communication, and a semiconductor testing apparatus having the same.

According to an aspect of the present invention, a wireless interface probe card comprises a substrate member and a transmission member. The substrate member may include a plurality of probe terminals having a predefined pitch, the probe terminals capable of directly contacting a plurality of pads, the pads having the predefined pitch, the pads being arranged on each of a plurality of semiconductor chips on a wafer to perform a test of the semiconductor chips. The transmission member is arranged on the substrate member. The transmission member may be configured to wirelessly receive a test signal, to provide the received test signal to at least one of the pads through at least one of the probe terminals, and to wirelessly transmit electrical characteristics of at least one of the semiconductor chips received via at least one of the pads through at least one of the probe terminals.

The substrate member may comprise a first silicon substrate having a plurality of first wiring lines arranged at a first pitch, and a second silicon substrate having a plurality of second wiring lines arranged at a second pitch. The second silicon substrate may be stacked on the first silicon substrate to form the probe terminals by electrically coupling the second wiring lines to the first wiring lines.

The first silicon substrate may further comprise a plurality of first through holes penetrating the first silicon substrate, wherein the first wiring lines are respectively embedded in the first through holes, wherein the second silicon substrate further comprises a plurality of second through holes penetrating the second silicon substrate, and wherein the second wiring lines are respectively embedded in the second through holes.

The transmission member may comprise a plurality of transceivers arranged on the substrate member respectively corresponding to the probe terminals, and a plurality of antennas arranged on the substrate member, each antenna corresponding to one of the transceivers, each antenna configured to receive the test signal and to provide the received test signal to the corresponding transceiver, and to externally transmit the electrical characteristics of at least one of the semiconductor chips received via at least one of the pads through at least one of the probe terminals.

According to another aspect of the present invention, a semiconductor testing apparatus may comprise a tester head configured to provide a test signal to each of a plurality of pads arranged at a constant pitch on each of a plurality of semiconductor chips arranged on a wafer, and to determine whether any of the semiconductor chips are defective by receiving electrical characteristics of the semiconductor chips via the pads. The wireless interface probe card may comprise a substrate member and a tranceiver member. The substrate member may include a plurality of probe terminals arranged at the constant pitch, the probe terminals capable of directly contacting the pads arranged at the constant pitch on each of the semiconductor chips arranged on the wafer to perform a test of the semiconductor chips arranged on the wafer. The transceiver member may be arranged on the substrate member to wirelessly receive the test signal, to provide the received test signal to the pads through the probe terminals, and to wirelessly transmit the electrical characteristics of the semiconductor chips received via the pads. The wireless interface card may be configured to receive the test signal from the tester head, to wirelessly transmit the received test signal to the transceiver member of the probe card, and to wirelessly receive the electrical characteristics of the semiconductor chips from the transceiver member of the interface probe card.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

Figure 1A:
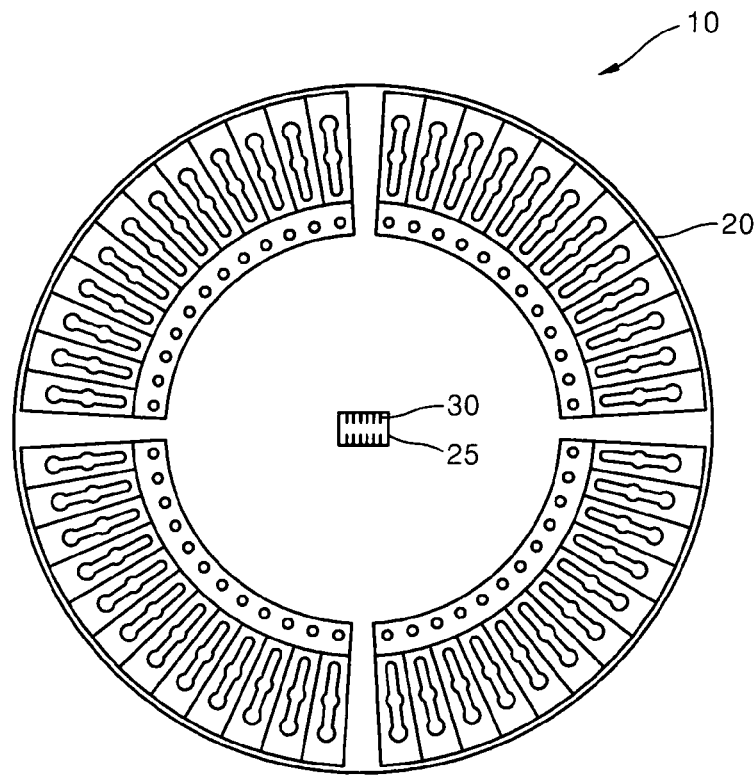
FIGS. 1A and 1B are, respectively, a plan view and a cross-sectional view of a conventional probe card.
Figure 1B:
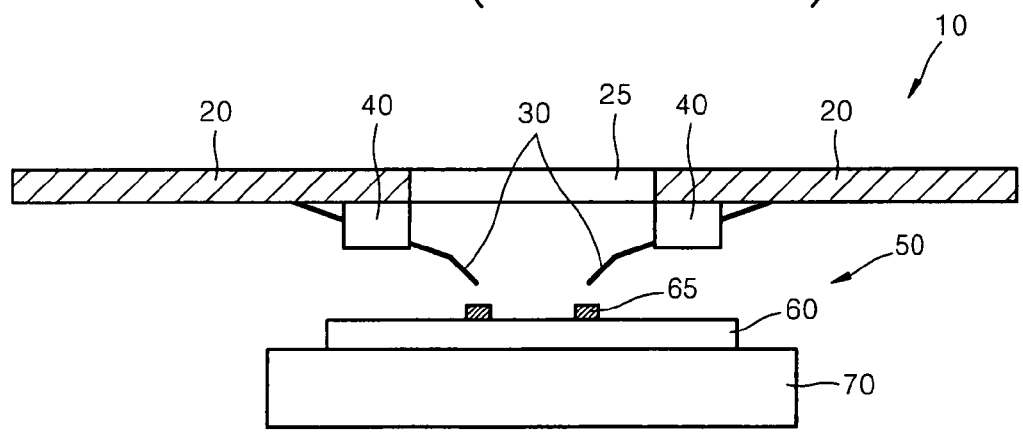

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals in the drawings denote like elements, and thus their description will be omitted.

Figure 2:
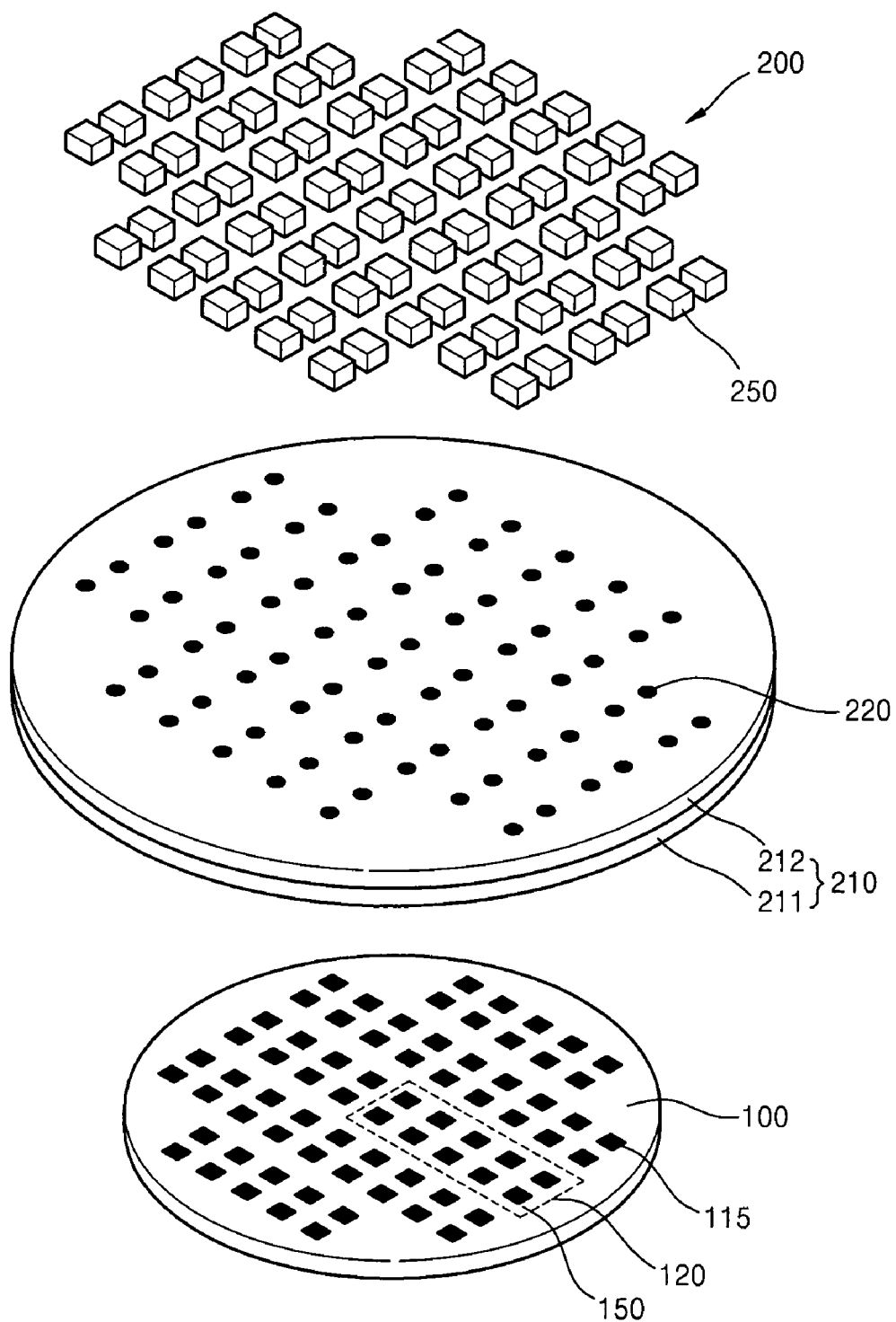
FIG. 2 illustrates the structure of a wireless interface probe card according to an embodiment of the present invention.
Figure 3:
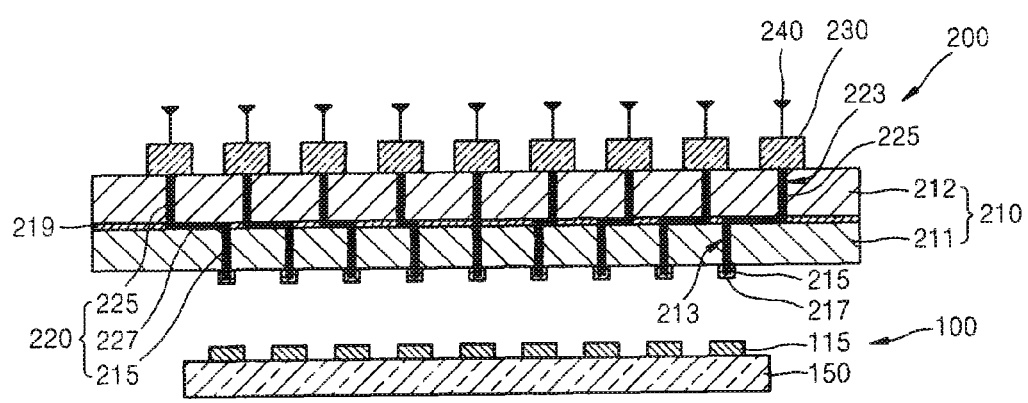
FIG. 3 is a cross-sectional view of the wireless interface probe card of FIG. 2.
Figure 4:
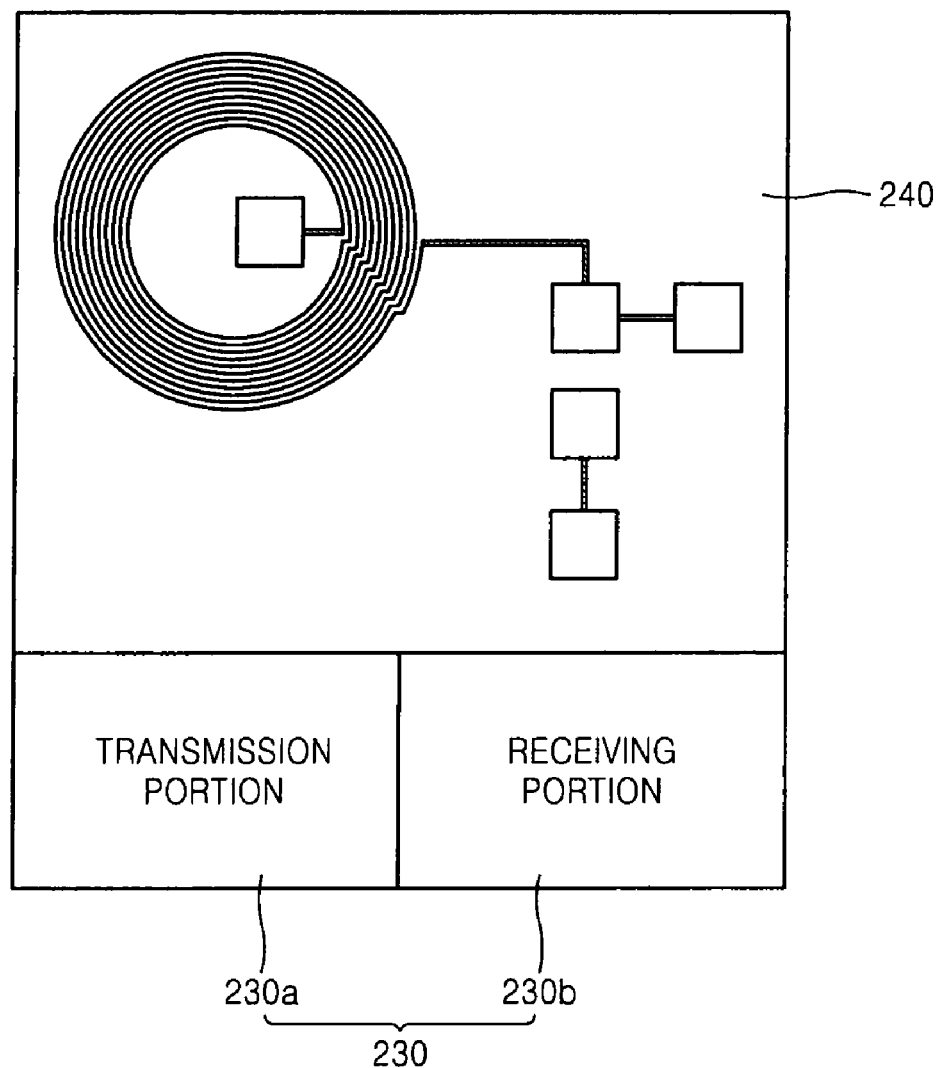
FIG. 4 illustrates a plane arrangement structure of a transmission member of the wireless interface probe card of FIG. 2.

FIG. 2 illustrates the structure of a wireless interface probe card according to an embodiment of the present invention. FIG. 3 is a cross-sectional view of the wireless interface probe card of FIG. 2. FIG. 4 illustrates an example of the transmission member of FIGS. 2 and 3.

Referring to FIGS. 2 through 4, a wireless interface probe card 200 includes a substrate member 210 and a plurality of transmission members 250. The substrate member 210 includes a plurality of probe terminals 220. The probe terminals 220 may be arranged corresponding to a plurality of pads 115 arranged on a wafer 100 to be tested. On the wafer 100, a plurality of semiconductor chips 150 are arranged in each of a plurality of semiconductor chip regions (e.g., semiconductor chip region 120). The pads 115 are arranged on each of the semiconductor chips 150. The probe terminals 220 may be arranged corresponding to the pads 115, which are arranged on each of the semiconductor chips 150.

The substrate member 210 may include a first silicon substrate 211 and a second silicon substrate 212. The first silicon substrate 211 includes a plurality of through holes 213 having a predefined pitch, which may be a constant pitch, and a plurality of first wiring lines 215 embedded in the through holes 213. The pitch between the first wiring lines 215 can be substantially the same as that of the pads 115 arranged on the wafer 100. The first wiring lines 215 may comprise copper.

The second silicon substrate 212 includes a plurality of through holes 223 having a predefined pitch, which may be a constant pitch, and a plurality of second wiring lines 225 embedded in the through holes 223. The pitch between the second wiring lines 225 can be greater than that of the first wiring lines 215. The second wiring lines 225 may comprise copper. The second silicon substrate 212 further includes a plurality of third wiring lines 227 arranged on a surface facing the first silicon substrate 211 and coupled to the second wiring lines 225. The third wiring lines 227 may comprise copper.

The second silicon substrate 212 is stacked on the first silicon substrate 211. The second wiring lines 225 are coupled to the first wiring lines 215 via the third wiring lines 227, thereby forming the probe terminals 220. An adhesive layer 217 to improve an adhesive coupling between the pads 115 of the wafer 100 and the probe terminals 220 can be further formed at a portion of each of the probe terminals 220. In other words, an exposed portion of each of the first wiring lines 215 may contact each of the pads 115 of the wafer 100. The adhesive layer 217 may comprise a gold plated layer. The second silicon substrate 212 is attached to the first silicon substrate 211 by an adhesive member 219.

Although it is described in the above-described embodiment that the two-layered silicon substrates are stacked, silicon substrates having more than two layers (i.e., multilayered silicon substrates) can also be stacked. Further, each silicon substrate may include a plurality of wiring lines, each being arranged in a through hole. The wiring lines may be vertically arranged in the silicon substrates, and may be laterally coupled by the third wiring lines to form the probe terminals.

The transmission members 250 are arranged on the substrate member 210. The transmission members 250 may be arranged corresponding to the probe terminals 220. The transmission members 250 are integrated on the second silicon substrate 212 through a typical semiconductor manufacturing process and a plane arrangement structure thereof is shown in FIG. 4. Each of the transmission members 250 includes a transceiver 230 for signal transmission with a tester head 400 of FIG. 5 and an antenna 240 for signal communication with the transceiver 230. The transceiver 230 includes a transmission portion 230a and a receiving portion 230b. The transmission portion 230a, the receiving portion 230b, and the antenna 240 can be arranged on the same plane of the second silicon substrate 212. The antenna can have a directive spiral structure.

Although in the present embodiment the antenna 240 is configured to have a one-to-one corresponding relationship with the transceiver 230, other embodiments may use a single antenna 240, which is configured to correspond to a plurality of transceivers 230 to transmit and receive signals using multiplexing technology.

Figure 5:
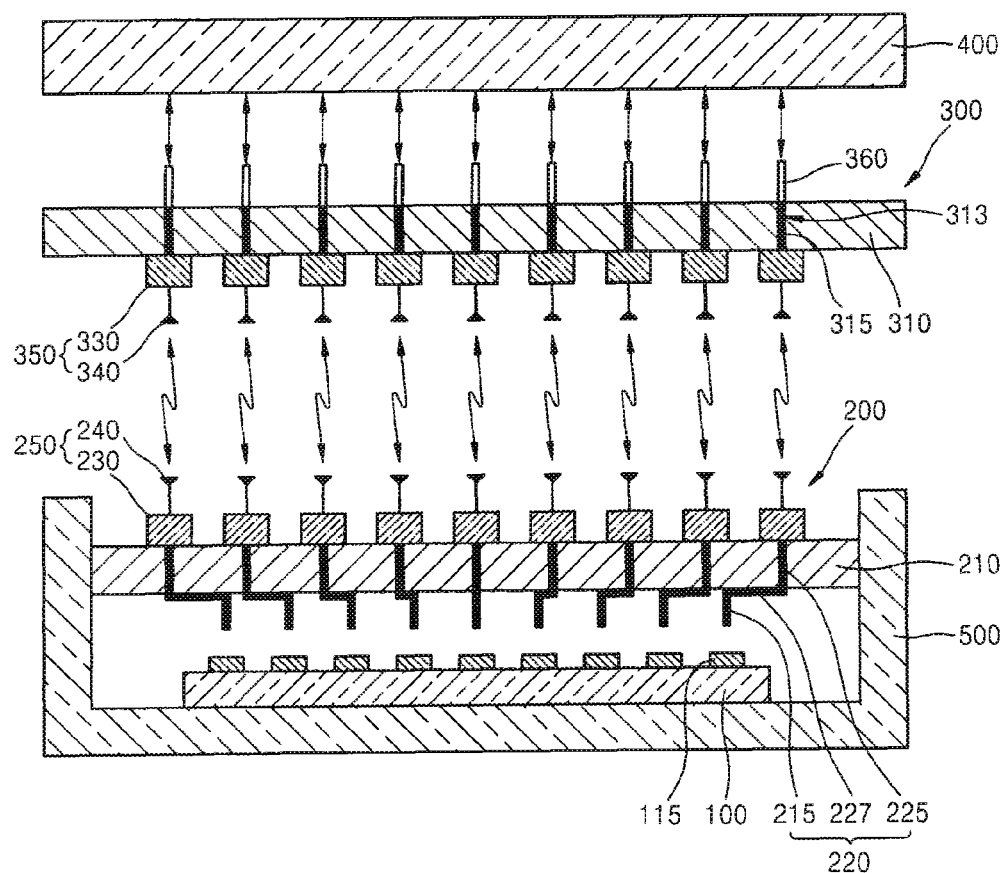
FIG. 5 illustrates the structure of a semiconductor testing apparatus having a wireless interface probe card of FIG. 2.

FIG. 5 illustrates the structure of a semiconductor testing apparatus having the wireless interface probe card 200 of FIGS. 2 and 3. Referring to FIG. 5, a semiconductor testing apparatus may include the wireless interface probe card 200 to test the semiconductor chips 150 of FIG. 2 arranged on the wafer 100 to be tested, a wireless interface card 300, and the tester head 400. The test performed may be a one-shot test. The probe card 200 is a wafer type probe card, which may be configured as shown in FIGS. 2 and 3. The tester head 400 provides a test signal from a tester (not shown) to the probe card 200 in order to test the electrical characteristic of the semiconductor chips 150 of the wafer 100. Also, the tester head 400 provides the electrical characteristic of the semiconductor chips 150 to the tester via the probe card 200 so that the tester can determine whether the semiconductor chips 150 arranged on the wafer 100 are defective.

The wireless interface card 300 is a wafer type card to interface wireless signal transmission between the probe card 200 and the tester head 400. The wireless interface card 300 includes a substrate member 310 and a plurality of transmission members 350. The substrate member 310 can include a silicon substrate. The substrate member 310 includes a plurality of through holes 313, which may have a predefined pitch, which may be a constant pitch. A plurality of wiring lines 315 may be embedded in the through holes 313. The wiring lines 315 may comprise copper. The pitch between the wiring lines 315 may be substantially the same as that of the second wiring lines 225 of the substrate member 210 of the probe card 200.

The transmission members 350 are arranged on a surface of the substrate member 310. The transmission members 350 are respectively arranged at the wiring lines 315. Each of the S transmission members 350 includes a transceiver 330 arranged corresponding to each of the wiring lines 315 and an antenna 340. The transmission members 350 are integrated on the substrate member 310 through a typical semiconductor manufacturing process. The transmission members 350 may be arranged to correspond to the transmission members 250 of the probe card 200, and can have the plane arrangement structure of FIG. 4 similar to the transmission members 250.

Each of the transmission members 350 may include the transceiver 330 for signal transmission with the tester head 400 and the antenna 340. The transceiver 330 may include a transmission portion 330a of FIG. 6B and a receiving portion 330B of FIG. 6B. The transmission portion 330a, the receiving portion 330b, and the antenna 340 can be arranged on the same plane of the substrate member 310. The antenna 340 can have a directive spiral structure.

Although in the present embodiment the antenna 340 is arranged to have a one-to-one corresponding relationship with the transceiver 330, other embodiments may use a single antenna 340, which is configured to correspond to a plurality of the transceivers 330 to transmit and receive signals using multiplexing technology.

A signal transmission member 360 for wired signal transmission may further be arranged on the other surface of the wireless interface card 300. The signal transmission member 360 may be arranged corresponding to the wiring lines 315. The signal transmission member 360 may include a flexible coaxial cable. In addition, the signal transmission member 360 provides the test signal from the tester head 400 to the wireless interface card 300, or the electrical characteristic signal from the semiconductor chips 150 of the wafer 100 to the tester head 400.

The semiconductor testing apparatus further includes a contact holder 500 to support the wafer 100 and the probe card 200 when the pads 115 of the wafer 100 contact the probe terminals 220 of the probe card 200 for testing the wafer 100.

Figure 6A:
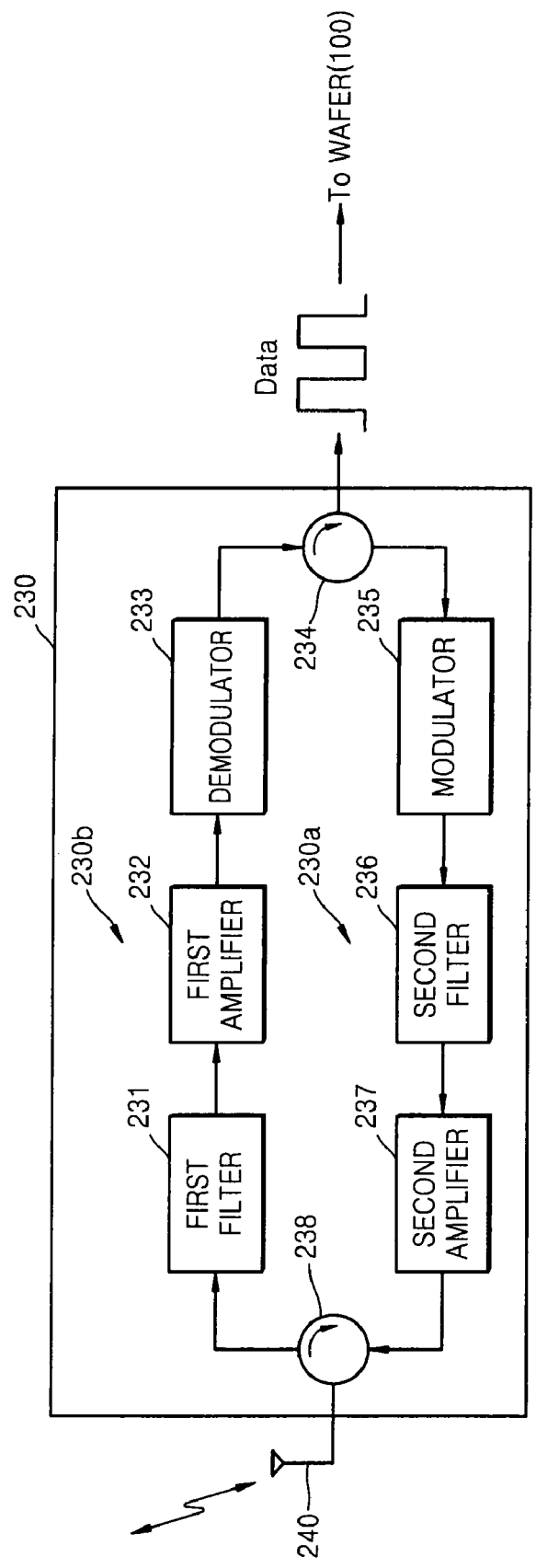
FIG. 6A is a circuit block diagram of the transmission member of the wireless interface probe card of the semiconductor testing apparatus of FIG. 5.

FIG. 6A is a circuit block diagram of the transceiver 230 of the wireless interface probe card 200 of FIG. 5. Referring to FIG. 6A, the transceiver 230 may include the transmission portion 230a for transmitting the electrical characteristic signal from the pads 115 of the wafer 100 to the antenna 240, and the receiving portion 230b for receiving a test signal from the antenna 240, and providing the test signal to the pads 115 of the wafer 100 via the probe terminals 220.

The receiving portion 230b may include a first filter 231 for filtering a test signal transmitted by the antenna 240, a first amplifier 232 for amplifying an output signal of the first filter 231, and a demodulator 233 for demodulating an output signal of the first amplifier 232 and providing a demodulated signal to the wafer 100. The transmission portion 230a may include a modulator 235 for modulating the electrical characteristic signal from the wafer 100, a second filter 236 for filtering an output signal of the modulator 235, and a second amplifier 237 for amplifying an output signal of the second filter 236 and providing an amplified output signal to the antenna 240.

The transceiver 230 may further include a first duplexer 234 for transferring an output signal of the demodulator 233 to the wafer 100 during a receiving operation, and transferring the electrical characteristic signal from the wafer 100 to the modulator 235 during a transmission operation. The transceiver 230 may further include a second duplexer 238 for transferring a test signal from the antenna 240 to the first filter 231 during a receiving operation, and transferring the output signal from the second amplifier 237 to the antenna 240 during a transmission operation.

Figure 6B:
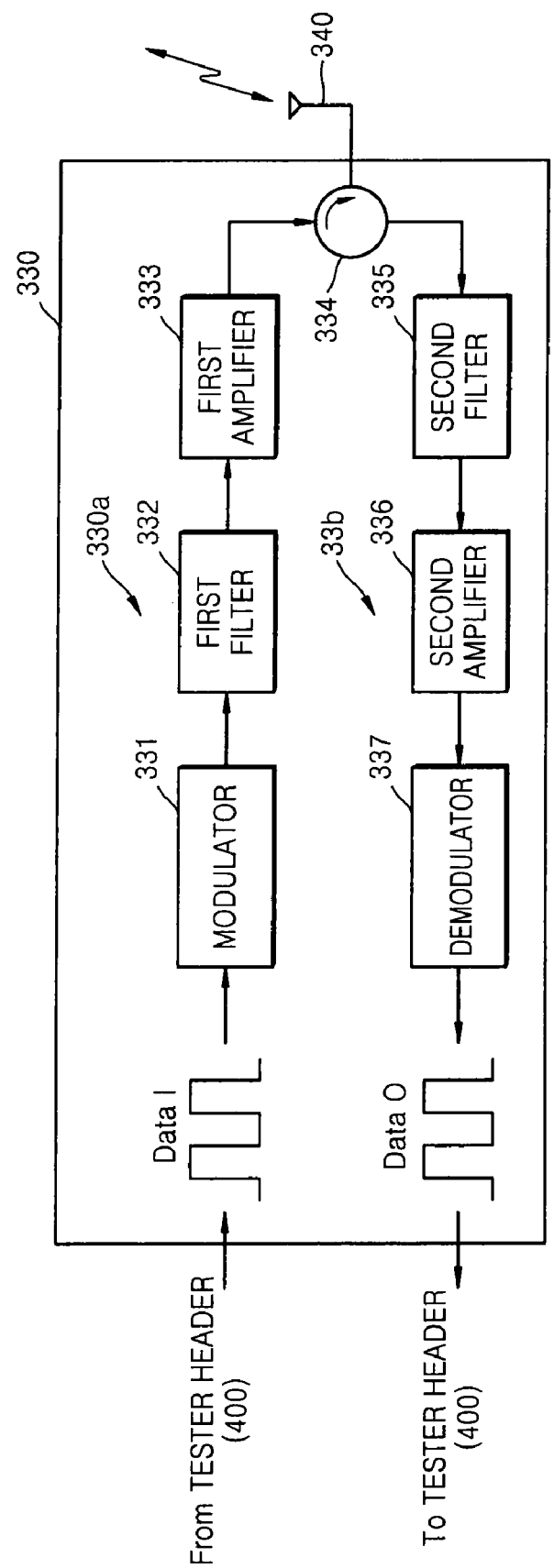
FIG. 6B is a circuit block diagram of the transmission member of the wireless interface card of the semiconductor testing apparatus of FIG. 5.

FIG. 6B is a circuit block diagram of the transceiver 330 of the wireless interface card of FIG. 5. Referring to FIG. 6B, the transceiver 330 may include a transmission portion 330a for transmitting a test signal (i.e., Data I) from the tester header 400 to the antenna 340, and a receiving portion 330b for providing the electrical characteristic signal (i.e., Data O) from the antenna 340 to the tester head 400.

The transmission portion 330a may include a modulator 331 for modulating a test signal from the tester head 400, a first filter 332 for filtering an output signal of the modulator 331, and a first amplifier 333 for amplifying an output signal of the first filter 332 and providing an amplified output signal to the antenna 340. The receiving portion 330a may include a second filter 335 for filtering a test signal transmitted by the antenna 340, a second amplifier 336 for amplifying an output signal of the second filter 335, and a demodulator 337 for demodulating an output signal of the second amplifier 336 and providing a demodulated output signal to the tester head 400.

The transceiver 330 may further include a duplexer 334 for transferring an output signal of the first amplifier 333 to the antenna 340 during a transmission operation, and for transferring the electrical characteristic signal of the wafer 100, received from the antenna 340, to the second filter 335 during a receiving operation.

Figure 7A:
FIGS. 7A through 7K are cross-sectional views for explaining a method of manufacturing a wireless interface probe card according to an embodiment of the present invention.
Figure 7B:
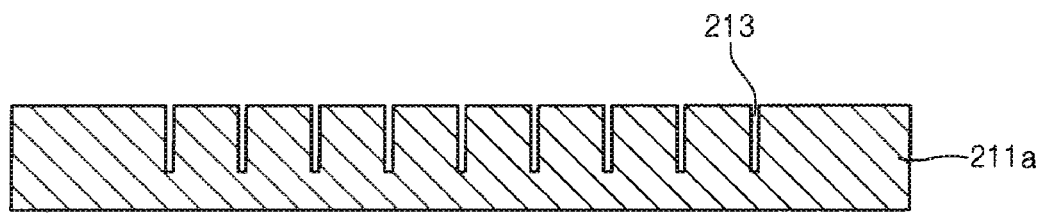
Figure 7C:
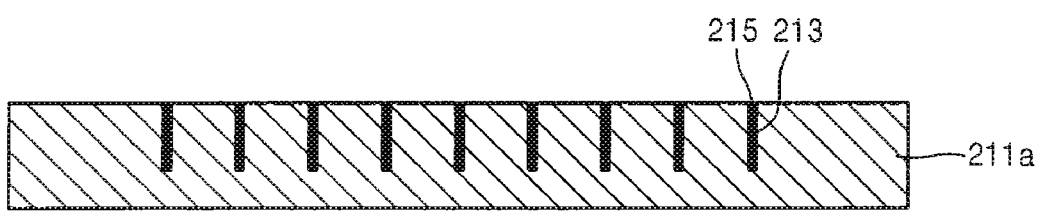
Figure 7D:
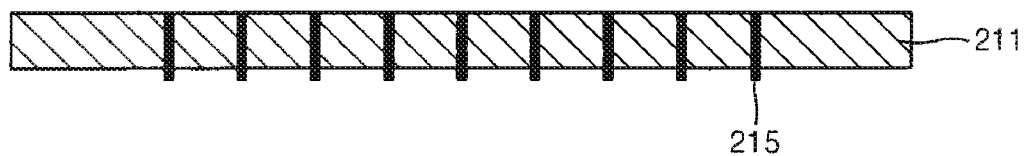
Figure 7E:
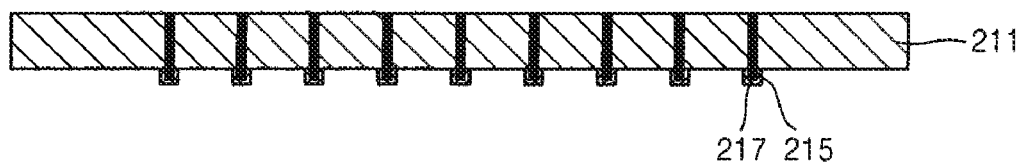
Figure 7F:
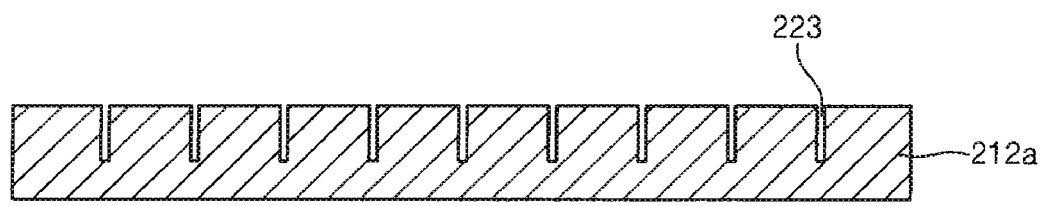
Figure 7G:
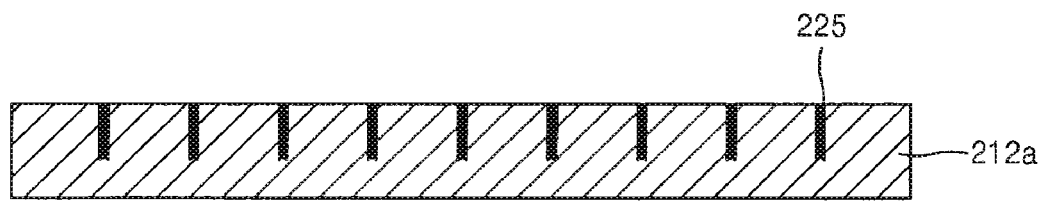
Figure 7H:
Figure 7I:
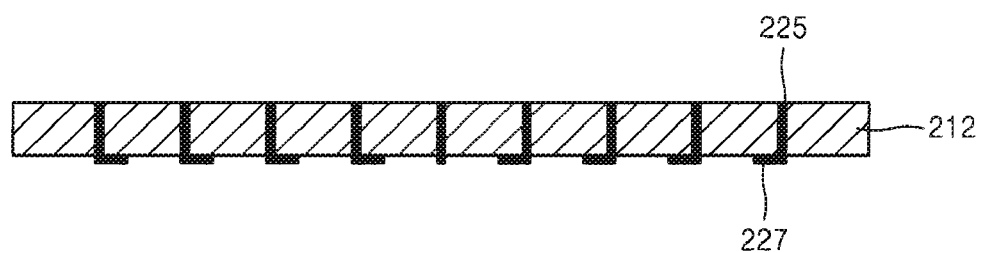
Figure 7J:
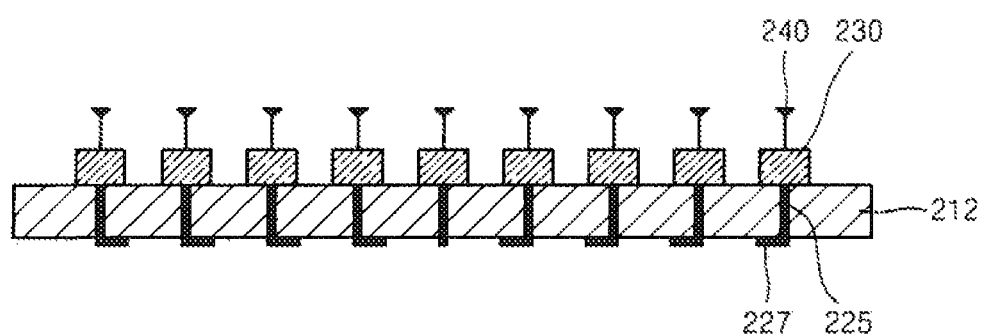
Figure 7K:
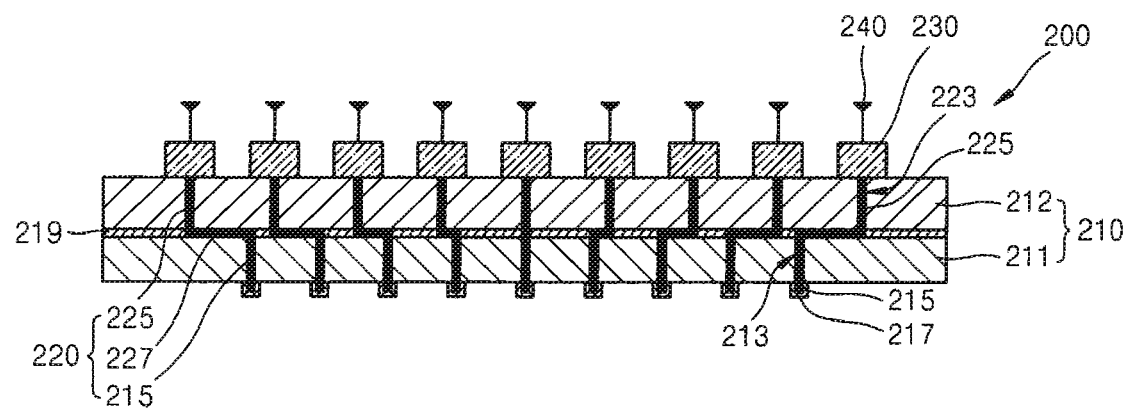

FIGS. 7A through 7K are cross-sectional views for explaining a method of manufacturing a wireless interface probe card of FIGS. 2 and 3. FIG. 7K is a cross-sectional view showing that the probe terminals of the probe card and the pads of the semiconductor wafer may contact each other.

Referring to FIG. 7A, a first silicon substrate 211a having a predefined thickness is provided. Referring to FIG. 7B, the through holes 213 arranged at a predefined pitch (in one embodiment, a constant pitch) and may be formed by etching the front surface of the first silicon substrate 211a to a predefined depth. Referring to FIG. 7C, the first wiring lines 215 may be formed by embedding a metal material in the through holes 213. The pitch between the first wiring lines 215 can be substantially the same as that between pads 215 of the wafer 100. The metal material may comprise copper.

Referring to FIG. 7D, the rear surface of the first silicon substrate 211a may be etched. Specifically, to secure a sufficient contact between the first wiring lines 215 and the pads 115 of the wafer 100, the rear surface of the first silicon substrate 211a is etched to expose a part of the first wiring lines 215. Thus, the first wiring lines 215 protrude from the rear surface of the first silicon substrate 211. Referring to FIG. 7E, the adhesive layer 217 may further be formed on the exposed part of the first wiring lines 215 to improve adhesiveness with the pads 215 of the wafer 100. The adhesive layer 217 may comprise a gold plate layer.

Referring to FIG. 7F, a second silicon substrate 212a is provided. The through holes 223 may be arranged at a predefined or constant pitch, and are formed by etching the front surface of the second silicon substrate 212a. Referring to FIG. 7G, the second wiring lines 225 are formed by embedding a metal material in the through holes 223. The metal material may comprise copper. The pitch between the second wiring lines 225 can be greater than that between the first wiring lines 215. Referring to FIG. 7H, the second wiring lines 225 are exposed by etching the rear surface of the second silicon substrate 212. The second wiring lines 225 can be accessed by etching the second silicon substrate 212a to expose the upper surface thereof only, as shown in FIG. 7H, or by etching the second silicon substrate 212a to make the second wiring lines 225 protrude from the rear surface of the second silicon substrate 212, as shown in FIG. 7D.

Referring to FIG. 7I, the third wiring lines 227, which are electrically coupled to the second wiring lines 225, may further be provided on the rear surface of the second silicon substrate 212. The third wiring lines 227 may comprise copper. The third wiring lines 227 laterally couple the first wiring lines 215 and the second wiring lines 225, which may have different pitches. When the size of the probe card 200 is substantially the same as that of the wafer 100, the pitch between the first wiring lines 215 is substantially the same as that between the pads 215 of the wafer 100, and the pitch of the second wiring lines 225 is substantially the same as that between the first wiring lines 215. Thus, the first wiring lines 215 arranged on the first silicon substrate 211 can directly contact the second wiring lines 225 of the second silicon substrate 212.

Referring to FIG. 7J, the transceiver 230 and the antenna 240 are arranged on the second silicon substrate 212 corresponding to the second wiring lines 225. The transceiver 230 and the antenna 240 can be formed on the second silicon substrate 212 through a typical semiconductor manufacturing process. The transceiver 230 can be formed on the second silicon substrate 212 to be electrically coupled to the second wiring lines 225.

Referring to FIG. 7K, the second silicon substrate 212 may be stacked on the first silicon substrate 211. The first silicon substrate 211 and the second silicon substrate 212 may be attached to each other using the adhesive member 219. The probe terminals 220 may include the first wiring lines 215 of the first silicon substrate 211, which are coupled to the second wiring lines 225 of the second silicon substrate 212 through the third wiring lines 227.

Figure 7L:
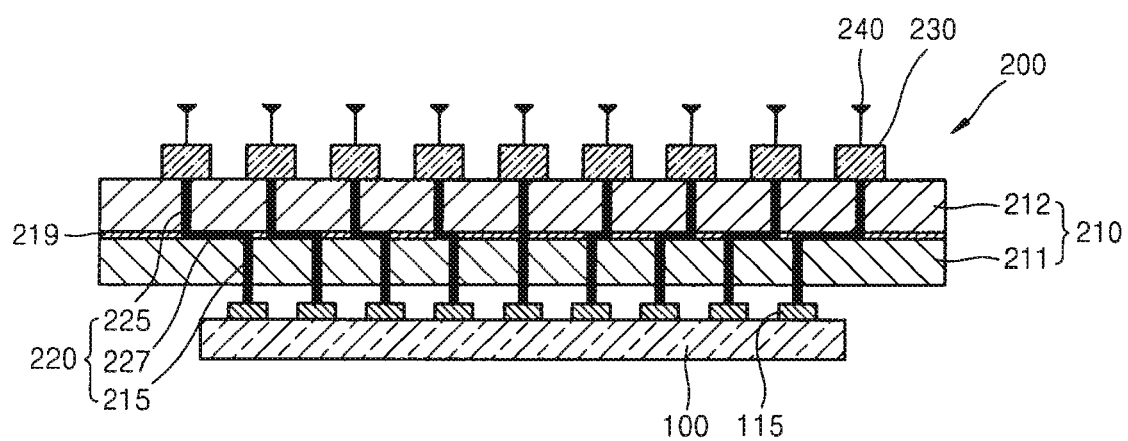
FIG. 7L is a cross-sectional view showing that probe terminals of the wireless interface probe card of the present invention contact pads of a semiconductor wafer to be tested.

Referring to FIG. 7L, the probe terminals 220 of the probe card 200 electrically contact the pads 115 of the wafer 100. To prevent damage to the probe terminals 220 of the probe card 200 and the pads 115 of the wafer 100, the probe card 200 and the wafer 100 may be vacuum pressed to closely contact each other.

As another embodiment, after the second wiring lines 225 are formed on the second silicon substrate 212, the first wiring lines 215 may be formed on the first silicon substrate 211. The third wiring lines 227 to electrically couple the first wiring lines 215 and the second wiring lines 225 may be formed on the first silicon substrate 211. The second silicon substrate 212 may be stacked on the first silicon substrate 211 to make the second wiring lines 225 contact the third wiring lines 227.

Figure 8A:
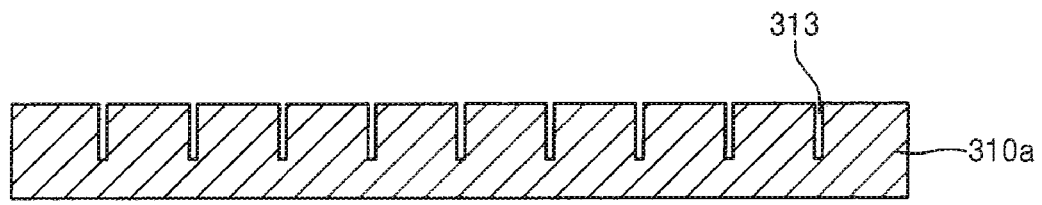
FIGS. 8A through 8D are cross-sectional views for explaining a method of manufacturing a wireless interface card according to an embodiment of the present invention.
Figure 8B:
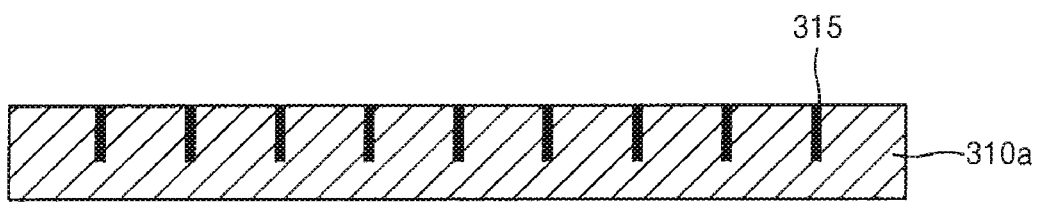
Figure 8C:

FIGS. 8A through 8D are cross-sectional views for explaining a method of manufacturing the wireless interface card 300 according to an embodiment of the present invention. Referring to FIG. 8A, a silicon substrate 310a is provided. A plurality of through holes 313 may be arranged at a predefined or constant pitch, and may be formed by etching the front surface of the silicon substrate 310a to a predefined depth. Referring to FIG. 8B, a plurality of wiring lines 315 are formed by embedding a metal material in the through holes 313. The pitch between the wiring lines 315 can be substantially the same as that between the second wiring lines 225. Referring to FIG. 8C, the wiring lines 315 are exposed by etching the rear surface of the silicon substrate 310a. The wiring lines 315 can be accessed by etching the silicon substrate 310a to expose only the upper surface of the silicon substrate 310a.

Figure 8D:
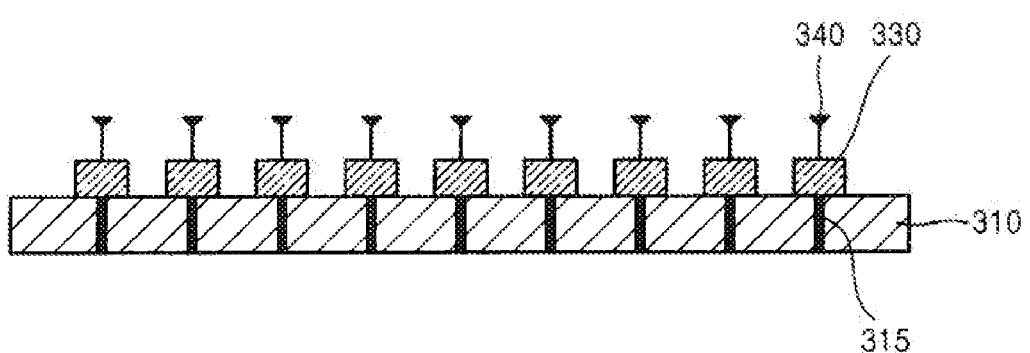

Referring to FIG. 8D, the transceiver 330 and the antenna 340 may be arranged on the silicon substrate 310 corresponding to the wiring lines 315. The transceiver 330 and the antenna 340 can be formed on the silicon substrate 310 through a typical semiconductor manufacturing process. The transceiver 330 can be formed on the silicon substrate 310 to be electrically coupled to the wiring lines 315.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A wireless interface probe card for a semiconductor testing apparatus, comprising:
a substrate member including a plurality of probe terminals having a predefined pitch, the probe terminals capable of directly contacting a plurality of pads, the pads having the predefined pitch, the pads being arranged on each of a plurality of semiconductor chips on a wafer to perform a test of the semiconductor chips; and a plurality of transmission members constructed and arranged on the substrate member to wirelessly receive a plurality of test signals, to provide the received test signals to the pads through corresponding probe terminals, and to wirelessly transmit electrical characteristics of at least one of the semiconductor chips received via the pads through corresponding probe terminals, wherein the plurality of transmission members comprise:

a plurality of respective transceivers arranged on the substrate member and respectively corresponding to the probe terminals; and a plurality of antennas, each antenna corresponding to one of the transceivers, wherein each of the transceivers comprises:

a receiving portion that comprises:

a first filter configured to filter at least one of the test signals received by an antenna of the plurality of antennas, a first amplifier configured to amplify an output signal of the first filter, and a demodulator configured to demodulate an output signal of the first amplifier and to provide a demodulated output signal to a probe terminal of the plurality of probe terminals;

a transmission portion that comprises:

a modulator configured to modulate at least one of the electrical characteristics of at least one of the semiconductor chips, a second filter configured to filter an output signal of the modulator, and a second amplifier configured to amplify an output signal of the second filter and to provide the amplified output signal to the antenna;

a first duplexer configured to transfer the demodulated output signal of the demodulator to the probe terminal during a receiving operation, and to transfer the at least one of the electrical characteristics from the probe terminal to the modulator during a transmission operation; and a second duplexer configured to transfer the at least one of the test signals from the antenna to the first filter during the receiving operation, and to transfer the amplified output signal of the second amplifier to the antenna during the transmission operation.

2. The wireless interface probe card of claim 1, wherein the substrate member comprises:

a first silicon substrate having a plurality of first wiring lines arranged at a first pitch; and a second silicon substrate having a plurality of second wiring lines arranged at a second pitch, wherein the second silicon substrate is stacked on the first silicon substrate to form the probe terminals by electrically coupling the second wiring lines to the first wiring lines.

3. The wireless interface probe card of claim 2, wherein the first silicon substrate further comprises a plurality of first through holes penetrating the first silicon substrate, wherein the first wiring lines are respectively embedded in the first through holes, wherein the second silicon substrate further comprises a plurality of second through holes penetrating the second silicon substrate, and wherein the second wiring lines are respectively embedded in the second through holes.

4. The wireless interface probe card of claim 3, wherein the first pitch between the first wiring lines is substantially the same as the second pitch between the second wiring lines, and wherein the first wiring lines are electrically coupled to the second wiring lines, respectively.

5. The wireless interface probe card of claim 4, wherein the first pitch between the first wiring lines and the second pitch between the second wiring lines are substantially the same as the predefined pitch between the pads arranged on each of the semiconductor chips.

6. The wireless interface probe card of claim 3, wherein the first pitch between the first wiring lines is smaller than the second pitch between the second wiring lines, and wherein the first pitch is substantially the same as the predefined pitch between the pads arranged on each of the semiconductor chips.

7. The wireless interface probe card of claim 6, wherein the substrate member further comprises a plurality of third wiring lines to electrically couple the first wiring lines and the second wiring lines, wherein the third wiring lines are arranged on a surface of the first silicon substrate facing the second silicon substrate, and directly coupled to the first wiring lines of the first silicon substrate and the second wiring lines of the second silicon substrate.

8. The wireless interface probe card of claim 6, wherein the substrate member further comprises a plurality of third wiring lines to electrically couple the first wiring lines and the second wiring lines, wherein the third wiring lines are arranged on a surface of the second silicon substrate facing the first silicon substrate, and directly coupled to the first wiring lines of the first silicon substrate and the second wiring lines of the second silicon substrate.

9. A semiconductor testing apparatus comprising:

a tester head configured to provide test signals to each of a plurality of pads arranged on each of a plurality of semiconductor chips arranged on a wafer, and to determine whether any of the semiconductor chips are defective by receiving electrical characteristics of each of the semiconductor chips via the pads;

a wireless interface probe card comprising a first substrate member including a plurality of probe terminals, the probe terminals capable of directly contacting the pads arranged on each of the semiconductor chips arranged on the wafer to perform a test of each of the semiconductor chips, and a plurality of transmission members arranged on the first substrate member to wirelessly receive the test signals, to provide the received test signals to the pads through the probe terminals, and to wirelessly transmit the electrical characteristics of each of the semiconductor chips received via the pads; and a wireless interface card comprising a second substrate member and configured to receive the test signals from the tester head, and including a plurality of transmission members arranged on the second substrate member to wirelessly transmit the received test signals to the plurality of transmission members of the wireless interface probe card, and to wirelessly receive the electrical characteristics of each of the semiconductor chips from the plurality of transmission members of the wireless interface probe card, wherein the first substrate member is separate from the second substrate member.

10. The semiconductor testing apparatus of claim 9, wherein the first substrate member comprises:

a first silicon substrate having a plurality of first wiring lines arranged at a first pitch; and a second silicon substrate having a plurality of second wiring lines arranged at a second pitch, wherein the second silicon substrate is stacked on the first silicon substrate to form the probe terminals by electrically coupling the second wiring lines to the first wiring lines.

11. The semiconductor testing apparatus of claim 10, wherein the first pitch between the first wiring lines is substantially the same as the second pitch between the second wiring lines, and wherein the first wiring lines are electrically coupled to the second wiring lines, respectively.

12. The semiconductor testing apparatus of claim 10, wherein the first pitch between the first wiring lines and the second pitch between the second wiring lines are substantially the same as the constant pitch between the pads arranged on each of the semiconductor chips.

13. The semiconductor testing apparatus of claim 12, wherein the first substrate member further comprises a plurality of third wiring lines to electrically couple the first wiring lines and the second wiring lines, wherein the third wiring lines are arranged on a surface of the first silicon substrate facing the second silicon substrate, and directly coupled to the first wiring lines of the first silicon substrate and the second wiring lines of the second silicon substrate.

14. The semiconductor testing apparatus of claim 9, wherein each of the transmission members of the wireless interface probe card comprises:
a first transceiver arranged on the first substrate member and corresponding to a probe terminal of the plurality of probe terminals and including a transmission portion to transmit at least one of the electrical characteristics of each of the semiconductor chips from the probe terminal through an antenna, and a receiving portion to receive at least one of the test signals through an antenna and to provide the received at least one test signal to the probe terminal.

15. The semiconductor testing apparatus of claim 14, wherein the receiving portion comprises:
a first filter configured to filter the at least one test signal received by the antenna;
a first amplifier configured to amplify an output signal of the first filter; and
a demodulator configured to demodulate an output signal of the first amplifier and to provide a demodulated output signal to a first duplexer,
wherein the transmission portion comprises:
a modulator configured to modulate the at least one electrical characteristic;
a second filter configured to filter an output signal of the modulator; and
a second amplifier configured to amplify an output signal of the second filter and to provide the amplified output signal to a second duplexer,
wherein the first duplexer is configured to transfer the demodulated output signal of the demodulator to the probe terminal during a receiving operation, and to transfer the at least one electrical characteristic from the probe terminal to the modulator during a transmission operation; and
wherein the second duplexer is configured to transfer the at least one test signal from the antenna to the first filter during the receiving operation, and to transfer the amplified output signal of the second amplifier to the antenna during the transmission operation.

16. The semiconductor testing apparatus of claim 9, wherein each of the plurality of transmission members of the wireless interface card comprises:
a tranceiver arranged on the second substrate member corresponding to a tranceiver of the wireless interface probe card and having a transmission portion to wirelessly transmit at least one of the test signals received from the tester head to the transceiver of the wireless interface probe card through an antenna, and a receiving portion to wirelessly receive at least one of the electrical characteristics from the transceiver of the wireless interface probe card through the antenna.

17. The semiconductor testing apparatus of claim 9, wherein each of the plurality of transmission members of the wireless interface card receives/transmits at least one of the electrical characteristics or at least one of the test signals from/to a corresponding transmission member of the wireless interface probe card.

18. A semiconductor testing system comprising:
a tester head configured to provide test signals;
a wireless interface card electrically coupled to the tester head, the wireless interface card configured to receive the test signals and to wirelessly transmit the test signals; and
a wireless interface probe card including a plurality of probe terminals configured to be coupled to pads of each of a plurality of semiconductor chips, the wireless interface probe card configured to wirelessly transmit electrical characteristics of each of the semiconductor chips to the wireless interface card responsive to the test signals,
wherein the wireless interface card includes a plurality of transmission members arranged on a first substrate member to wirelessly receive the electrical characteristics from the wireless interface probe card, and to wirelessly transmit the test signals to the wireless interface probe card,
wherein the wireless interface probe card includes a plurality of transmission members arranged on a second substrate member to wirelessly receive the test signals from the wireless interface card and to wirelessly transmit the electrical characteristics to the wireless interface card, and
wherein the first substrate member is separate from the second substrate member.

19. The semiconductor testing apparatus of claim 18, wherein each of the transmission members of the wireless interface card comprises:
a transceiver arranged on the first substrate member, the tranceiver corresponding to a transceiver of the wireless interface probe card and including a transmission portion to transmit at least one of the electrical characteristics to the test head through an antenna and a receiving portion to receive at least one of the test signals and to provide the received test signal to the transceiver of the wireless interface probe card through the antenna.

20. The semiconductor testing system of claim 18, wherein each of the plurality of transmission members of the wireless interface card receives/transmits at least one of the electrical characteristics or at least one of the test signals from/to a corresponding transmission member of the wireless interface probe card.

* * * * *